(12) United States Patent
Chandra

(10) Patent No.: US 7,587,692 B2
(45) Date of Patent: *Sep. 8, 2009

(54) METHOD AND APPARATUS FOR FULL-CHIP THERMAL ANALYSIS OF SEMICONDUCTOR CHIP DESIGNS

(75) Inventor: Rajit Chandra, Cupertino, CA (US)

(73) Assignee: Gradient Design Automation, Inc., Santa Clara, CA (US)

( * ) Notice: Subject to any disclaimer, the term of this patent is extended or adjusted under 35 U.S.C. 154(b) by 185 days.

This patent is subject to a terminal disclaimer.

(21) Appl. No.: 11/668,370

(22) Filed: Jan. 29, 2007

(65) Prior Publication Data

US 2007/0120239 A1 May 31, 2007

Related U.S. Application Data

(63) Continuation of application No. 10/979,957, filed on Nov. 3, 2004, now Pat. No. 7,194,711.

(60) Provisional application No. 60/539,727, filed on Jan. 28, 2004.

(51) Int. Cl.
*G06F 17/50* (2006.01)
(52) U.S. Cl. .............................. 716/4; 716/5
(58) Field of Classification Search ...................... 716/1, 716/4–6
See application file for complete search history.

(56) References Cited

U.S. PATENT DOCUMENTS

| | | | |
|---|---|---|---|
| 4,696,578 A | 9/1987 | Mansuria et al. | |
| 5,550,750 A * | 8/1996 | Wolff | 716/10 |
| 5,654,904 A | 8/1997 | Thakur | |
| 5,710,068 A | 1/1998 | Hill | |
| 6,124,635 A | 9/2000 | Kuwabara | |
| 6,247,161 B1 | 6/2001 | Lambrecht et al. | |
| 6,320,201 B1 | 11/2001 | Corbett et al. | |
| 6,389,582 B1 * | 5/2002 | Valainis et al. | 716/9 |
| 6,505,326 B1 | 1/2003 | Farral et al. | |
| 6,532,570 B1 | 3/2003 | Mau | |
| 6,591,399 B1 | 7/2003 | Wyrzykowska et al. | |
| 6,634,013 B2 | 10/2003 | Shinzawa | |
| 6,662,345 B2 | 12/2003 | Uchida et al. | |
| 6,751,781 B2 | 6/2004 | Lin et al. | |
| 6,769,102 B2 | 7/2004 | Frank et al. | |
| 6,931,369 B1 | 8/2005 | Perry et al. | |

(Continued)

OTHER PUBLICATIONS

Wang, Ting-Yuan, et al., "Thermal-ADI-A Linear-Time Chip-Level Dynamic Thermal-Simulation Algorithm Based on Alternating-Direction-Implicit (ADI) Method", IEEE Transactions on Very Large Scale Integration (VLSI) Systems, vol. 11, No. 4, dated Aug. 4, 2003, pp. 691-700.

(Continued)

*Primary Examiner*—Jack Chiang
*Assistant Examiner*—Binh C Tat

(57) ABSTRACT

A method and apparatus for full-chip thermal analysis of semiconductor chip designs is provided. One embodiment of a novel method for performing thermal analysis of a semiconductor chip design comprises receiving at least one input relating to a semiconductor chip design to be analyzed. The input is then processed to produce a three-dimensional thermal model of the semiconductor chip design. In another embodiment, thermal analysis of the semiconductor chip design is performed by calculating power dissipated by transistors and interconnects included in the semiconductor chip design and distributing power dissipated by the interconnects.

21 Claims, 5 Drawing Sheets

U.S. PATENT DOCUMENTS

| | | |
|---|---|---|
| 6,993,742 B2 | 1/2006 | Fryer et al. |
| 7,025,280 B2 | 4/2006 | Kaushal et al. |
| 7,039,888 B2 | 5/2006 | Steinmann et al. |
| 7,096,450 B2 | 8/2006 | Gill et al. |
| 7,162,402 B2 | 1/2007 | Daems et al. |
| 7,171,346 B1 | 1/2007 | Recker et al. |
| 7,191,112 B2 | 3/2007 | Demler et al. |
| 7,191,413 B2 | 3/2007 | Chandra et al. |
| 7,194,711 B2 * | 3/2007 | Chandra .................. 716/4 |
| 7,203,920 B2 | 4/2007 | Chandra et al. |
| 7,263,477 B2 | 8/2007 | Chen et al. |
| 2001/0032330 A1 | 10/2001 | Kusunoki |
| 2003/0226122 A1 | 12/2003 | Hathaway et al. |
| 2005/0044515 A1 | 2/2005 | Acar et al. |
| 2005/0149886 A1 | 7/2005 | Kaushal et al. |
| 2005/0155004 A1 | 7/2005 | Miura et al. |
| 2005/0166166 A1 | 7/2005 | Chandra et al. |
| 2005/0210425 A1 | 9/2005 | Keller et al. |
| 2006/0031794 A1 | 2/2006 | Li et al. |
| 2007/0157137 A1 | 7/2007 | Chandra |

OTHER PUBLICATIONS

Wang, Ting-Yuan, et al., "3D Thermal-ADI- An Efficient Chip-Level Transient Thermal Simulator", *ISPD'03*, Apr. 6-9, 2003, Monterey, California, USA http://www.ece.wisc.edu/~vlsi/research/ISPD2003_p005-wang.pdf, Copy consists of "8" unnumbered pages.

Wang, Ting-Yuan, et al., "3-D Thermal-ADI: A linear-Time Chip Level Transient Thermal Simulator", IEEE Transactions on Computer-Aided Design of Integrated Circuits and Systems, vol. 21, No. 12, dated Dec. 2002, pp. 1434-1445.

Wang, Ting-Yuan, et al., "Thermal-ADI: A Linear-Time Chip-Level Dynamic Thermal Simulation Algorithm Based on Alternating-Direction-Implicit (ADI) Method", *ISPD'01*, Apr. 1-4, 2001, Sonoma, California, USA http://www.ece.wisc.edu/~vlsi/research/ISPD2001_wang.pdf, Copy consists of "6" unnumbered pages.

International Search Report and Written Opinion for PCT/US2006/062184; copy consists of 11 unnumbered pages.

Szekely, V., et al., A thermal benchmark chip: design and applications:, Components, Packaging, and Manufacturing Technology, Part A, IEEE Transactions on vol. 21, Issue 3, Sep. 1998, pp. 399-405.

Hang, Li, et al., "Efficient thermal simulation for run-time temperature tracking and management", Computer Design: VLSI Computers and Processors, 2005, ICCD 2005, Proceedings 2005 IEEE International Conference on Oct. 2-5, 2005, pp. 130-133.

* cited by examiner

METHOD AND APPARATUS FOR FULL-CHIP THERMAL ANALYSIS OF SEMICONDUCTOR CHIP DESIGNS

CROSS REFERENCE TO RELATED APPLICATIONS

This application is a continuation of U.S. patent application Ser. No. 10/979,957, filed Nov. 3, 2004 now U.S. Pat. No. 7,194,711, which in turn claims the benefit of U.S. Provisional Patent Application Ser. No. 60/539,727, filed Jan. 28, 2004, all of which are herein incorporated by reference in their entireties.

FIELD OF THE INVENTION

The present invention generally relates to semiconductor chip design, and more particularly relates to the thermal analysis of semiconductor chip designs.

BACKGROUND OF THE INVENTION

Semiconductor chips typically comprise the bulk of the components in an electronic system. These semiconductor chips are also often the hottest part of the electronic system, and failure of the system can often be traced back to thermal overload on the chips. As such, thermal management is a critical parameter of semiconductor chip design.

FIG. 1 is a schematic diagram illustrating an exemplary semiconductor chip 100. As illustrated, the semiconductor chip 100 comprises one or more semiconductor devices 102a-102n (hereinafter collectively referred to as "semiconductor devices 102"), such as transistors, resistors, capacitors, diodes and the like deposited upon a substrate 104 and coupled via a plurality of wires or interconnects 106a-106n (hereinafter collectively referred to as "interconnects 106"). These semiconductor devices 102 and interconnects 106 share power, thereby distributing a thermal gradient over the chip 100 that may range from 100 to 180 degrees Celsius in various regions of the chip 100.

Many methods currently exist for performing thermal analysis of semiconductor chips designs, e.g., to ensure that a chip constructed in accordance with a given design will not overheat and trigger a failure when deployed within an intended system. Such conventional methods, however, typically fail to provide a complete or an entirely accurate picture of the chip's operating thermal gradient. For example, typical thermal analysis models attempt to solve the temperature on the chip substrate, but do not solve the temperature in a full three dimensions, e.g., using industry standards design, package and heat sink data. Moreover, most typical methods do not account for the sharing of power among semiconductor devices and interconnects, which distributes the heat field within the chip, as discussed above.

Therefore, there is a need in the art for a method and apparatus for full-chip thermal analysis of semiconductor chip designs.

SUMMARY OF THE INVENTION

A method and apparatus for full-chip thermal analysis of semiconductor chip designs is provided. One embodiment of a novel method for performing thermal analysis of a semiconductor chip design comprises receiving at least one input relating to a semiconductor chip design to be analyzed. The input is then processed to produce a three-dimensional thermal model of the semiconductor chip design. In another embodiment, thermal analysis of the semiconductor chip design is performed by calculating power dissipated by heat-dissipating semiconductor devices (e.g., transistors, resistors, capacitors, etc.) and interconnects included in the semiconductor chip design and distributing power dissipated by at least one of the semiconductor devices and the interconnects.

BRIEF DESCRIPTION OF THE DRAWINGS

So that the manner in which the above recited embodiments of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures.

DETAILED DESCRIPTION

Embodiments of the invention generally provide a method and apparatus for three-dimensional thermal analysis of semiconductor chip designs. One embodiment of the inventive method produces a full, three-dimensional solution of temperature values within a chip design, including power dissipation values distributed over semiconductor devices (e.g., transistors, resistors, capacitors, diodes and the like) and wire interconnects, thereby providing chip designers with the data necessary to produce more robust semiconductor chips.

As used herein, the term "semiconductor chip" refers to any type of semiconductor chip, which might employ analog and/or digital design techniques and which might be fabricated in a variety of fabrication methodologies including, but not limited to, complementary metal-oxide semiconductor (CMOS), bipolar complementary metal-oxide semiconductor (BiCMOS), and gallium arsenide (GaAs) methodologies. Furthermore, as used herein, the term "semiconductor device" refers to a potential active heat dissipating device in a semiconductor chip, including, but not limited to, transistors, resistors, capacitors, diodes and inductors. The terms "wire", "interconnect" or "wire interconnect" as used herein refer to any of various means of distributing electrical signals (which may be analog or digital, static or dynamic, logic signals or power/ground signals) from one place to another. "Interconnects" may be on a semiconductor chip itself, used in the packaging of the semiconductor chip, deployed between the semiconductor chip and the packaging, or used in a variety of other ways.

Figure 1:
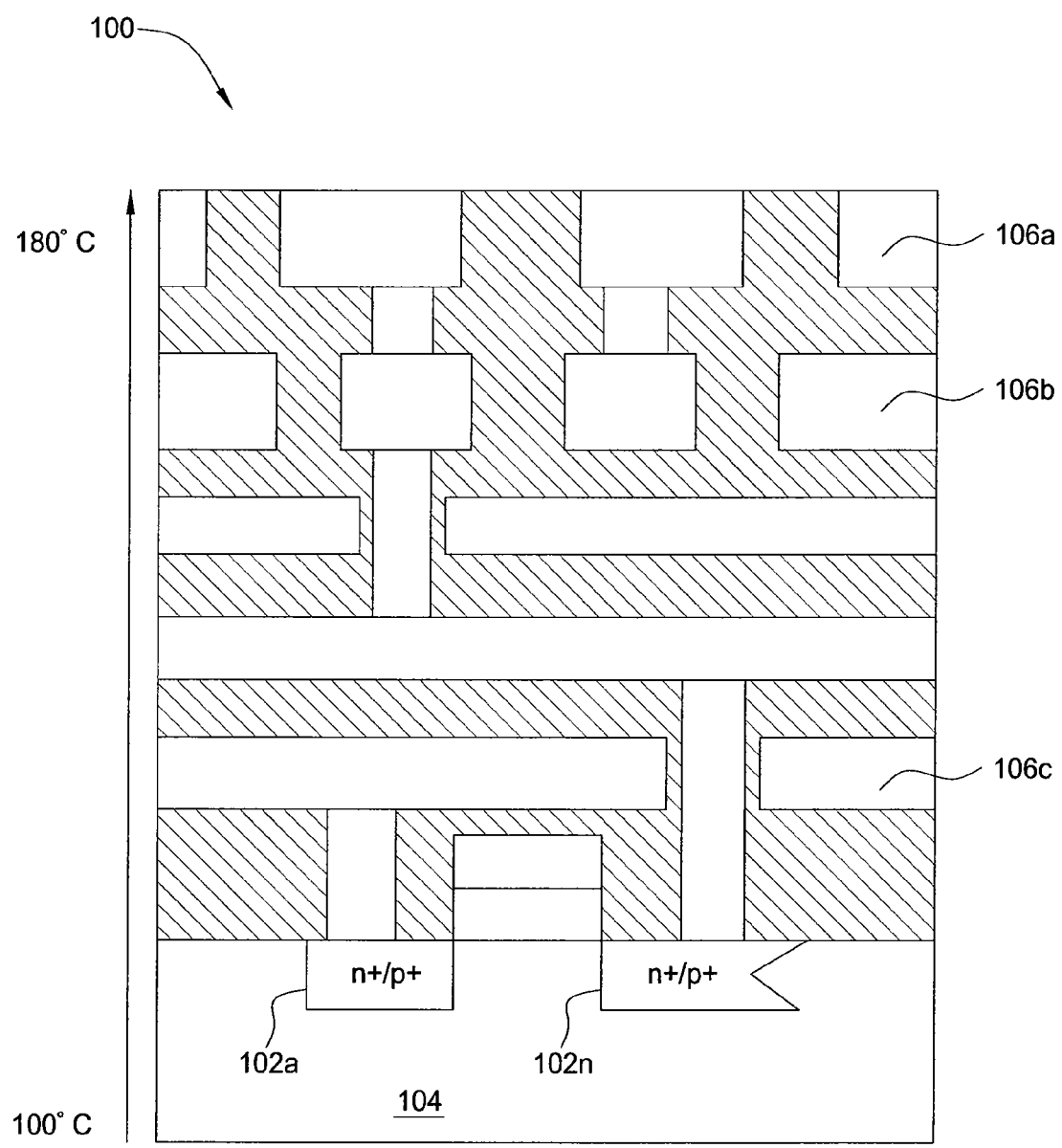
FIG. 1 is a schematic diagram illustrating an exemplary semiconductor chip.
Figure 2:
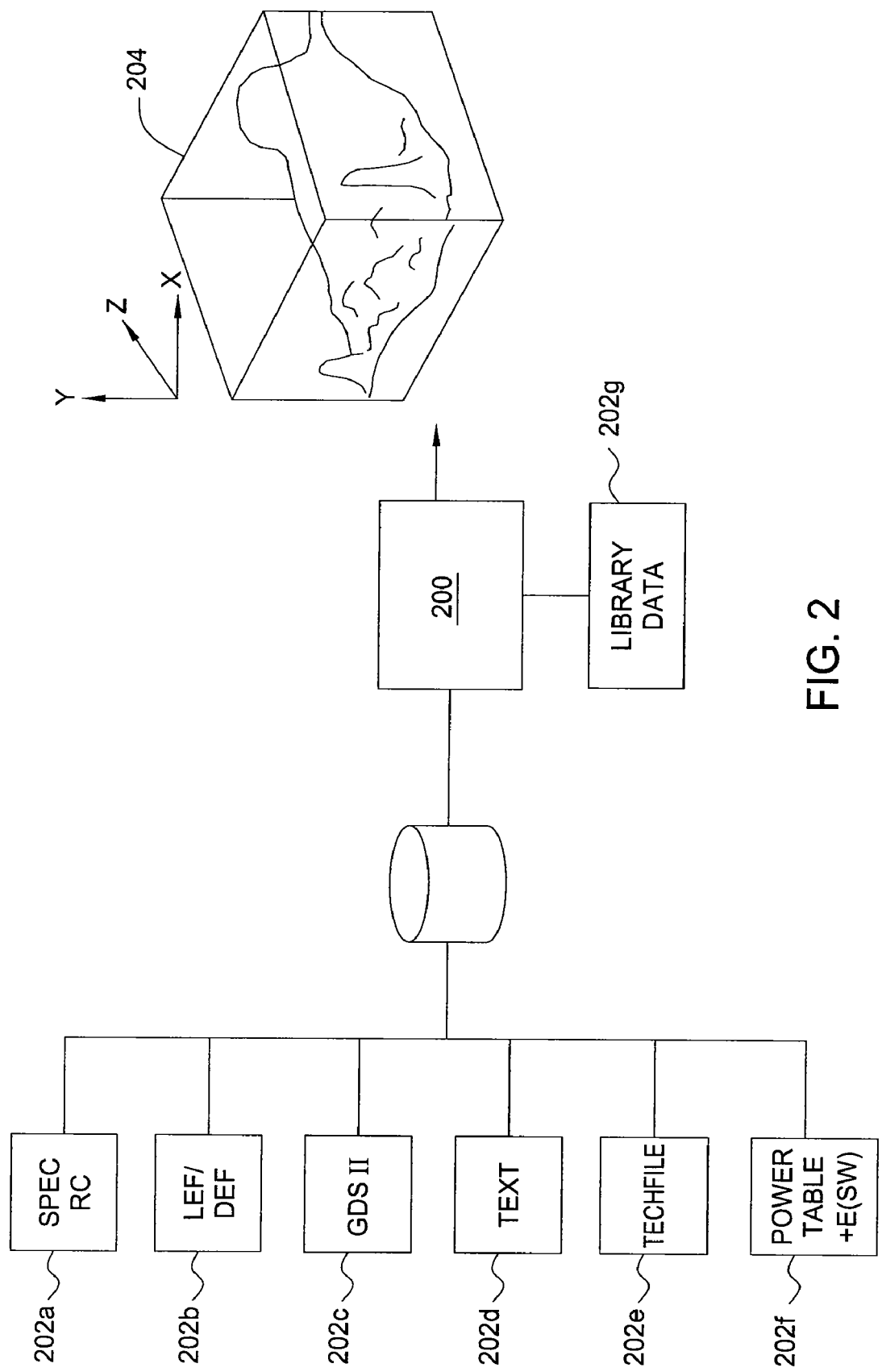
FIG. 2 is a schematic diagram illustrating one implementation of a thermal analysis tool according to the present invention.

FIG. 2 is a schematic diagram illustrating one implementation of a thermal analysis tool 200 according to the present invention. As illustrated, the thermal analysis tool 200 is adapted to receive a plurality of inputs 202a-202g (hereinafter collectively referred to as "inputs 202") and process these inputs 202 to produce a full-chip (e.g., three-dimensional) thermal model 204 of a proposed semiconductor chip design.

In one embodiment, the plurality of inputs 202 includes industry standard design data 202a-202f (e.g., pertaining to the actual chip design or layout under consideration) and library data 202g (e.g., pertaining to the semiconductor devices and interconnects incorporated in the design). In one embodiment, the industry standard design data includes one or more of the following types of data: electrical component extraction data and extracted parasitic data (e.g., embodied in standard parasitic extraction files, or SPEFs, 202a), design representations including layout data (e.g., embodied in Library Exchange Format/Design Exchange Format, or LEF/DEF files 202b, Graphical Design Format II, or GDSII, files 202c and/or text files 202d), manufacturer-specific techfiles 202e describing layer information and package models, user-generated power tables 202f including design data (e.g., including a switching factor, E(sw)). In one embodiment, this industry standard design data 202a-202f is stored in a design database such as an open access database or a proprietary database. In one embodiment, the library data 202g is embodied in a library that is distributed by a semiconductor part manufacturer or a library vendor. In another embodiment, the library incorporating the library data 202g can be built in-house by a user.

In one embodiment, the library data 202g includes transistor and diode models that are used to characterize the transistor resistances ($R_{dv}$) of the driver circuits, e.g., such as models available through Berkeley short-channel Insulated Gate Field Effect Transistor (IGFET) model (BSIM) models used by circuit simulators including Simulation Program with Integrated Circuit Emphasis (SPICE), HSPICE, commercially available from Synopsys, Inc. of Mountain View, Calif. and Heterogeneous Simulation Interoperability Mechanism (HSIM, commercially available from Nassda Corporation of Santa Clara, Calif.), all developed at the University of California at Berkeley.

As mentioned above, the plurality of inputs 202 are provided to the thermal analysis tool 200, which processes the data in order to produce a full-chip thermal model 204 of a proposed semiconductor chip design. In one embodiment, the full-chip thermal model is a three-dimensional thermal model.

Thus, as described above, embodiments of the present invention rely on library data representing the electrical properties of a semiconductor chip design (e.g., the resistance and capacitance at various points) and the manners in which these properties may vary with respect to each other and with respect to other phenomena (e.g., temperature or fabrication variations). Those skilled in the art will appreciate that these electrical properties may be specified or calculated in any number of ways, including, but not limited to, table-driven lookups, formulas based on physical dimensions, and the like.

Figure 3:
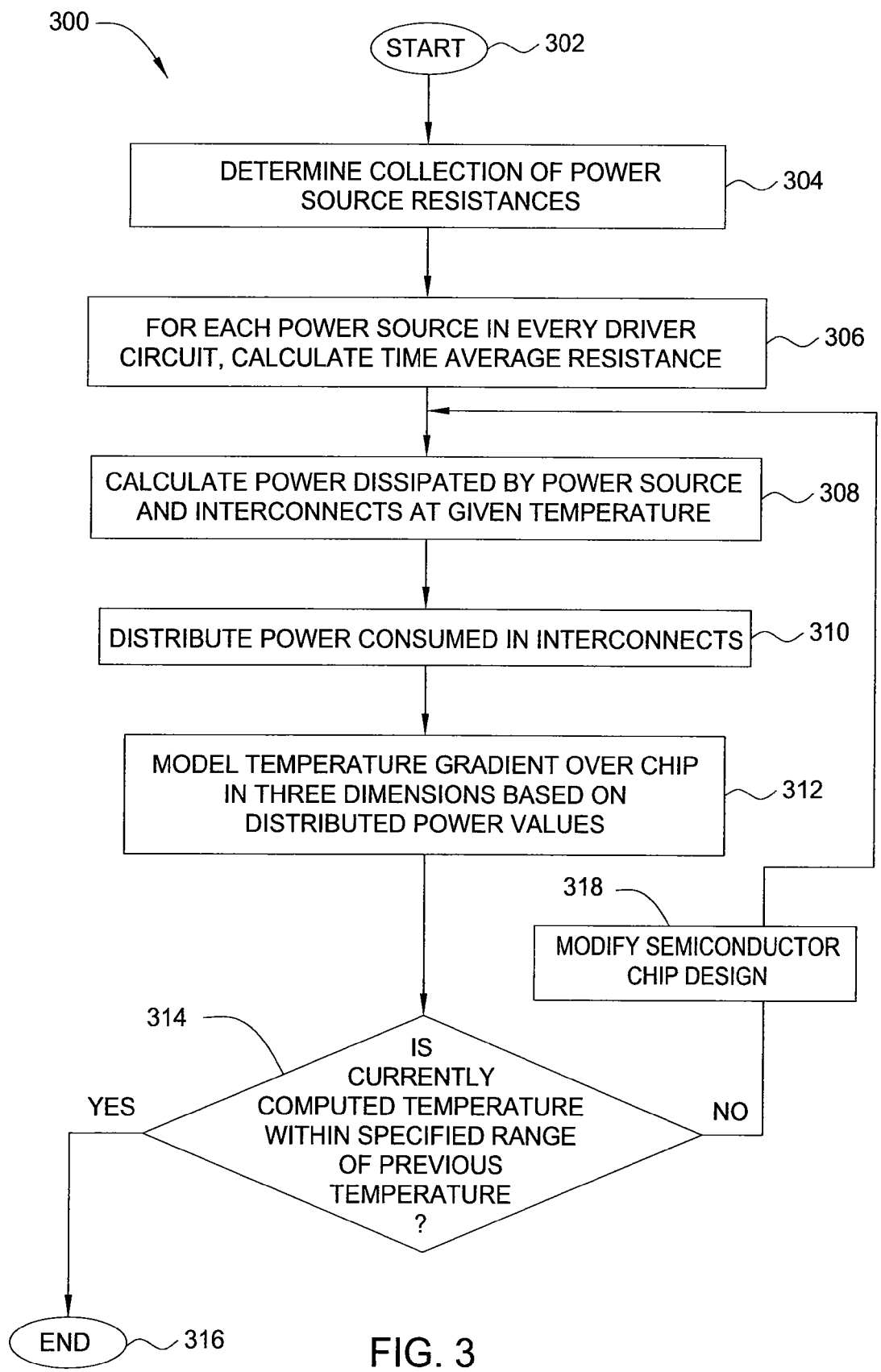
FIG. 3 is a flow diagram illustrating one embodiment of a method for performing three-dimensional thermal analysis of a semiconductor chip design according to the present invention.

FIG. 3 is a flow diagram illustrating one embodiment of a method 300 for performing full-chip thermal analysis of a semiconductor chip design according to the present invention. The method 300 may be implemented, for example, in the thermal analysis tool 200 illustrated in FIG. 2. In one embodiment, the method 300 relies on the computation of power dissipated by various semiconductor devices of the semiconductor chip design. As will be apparent from the following discussion, this power computation may be performed in any number of ways, including, but not limited to, table-driven lookups, computations based on electrical properties, circuit simulations, and the like. Moreover, those skilled in the art will appreciate that although the following description discusses the effects of resistance on power dissipation, power dissipation computations could be based on any number of other electrical properties or parameters, including, but not limited to, capacitance, inductance and the like. Moreover, the computations could be static or dynamic.

The method 300 is initialized at step 302 and proceeds to step 304, where the method 300 determines the collection of semiconductor devices (e.g., transistor, resistors, capacitors, diodes inductors and the like) and their resistances. In one embodiment, the method 300 determines this information by reading one or more of the chip layout data (e.g., in GDS II, DEF and/or text format), layer and package model data (e.g., from one or more techfiles), and initial power and power versus temperature data for the semiconductor devices (e.g., from the library data). In one embodiment, initial power values and power values as a function of temperature may be recorded within a common power table for acceptable operating ranges for the driver circuits within the chip design. The driver circuits may be at semiconductor device level or at cell level, where cell level circuits represent an abstraction of interconnected semiconductor devices making up a known function.

In step 306, the method 300 uses the information collected in step 304 to calculate the time average resistance values for every semiconductor device in every driver circuit of the chip design, as well as for every diode junction. These time-average resistance values relate to changes in semiconductor device dimensions (e.g., such as using higher power transistors in place of lower power transistors in a chip design). In one embodiment, the time average resistance value, $R_{average}$ for a semiconductor device is calculated as:

$$R_{average} = \frac{\int_0^{t_r} Rdv(t)\,dt}{t_r} \quad \text{(EQN. 1)}$$

where $t_r$ is the output transition time of the driver circuit under consideration, e.g., as specified by the library data.

Figure 4:
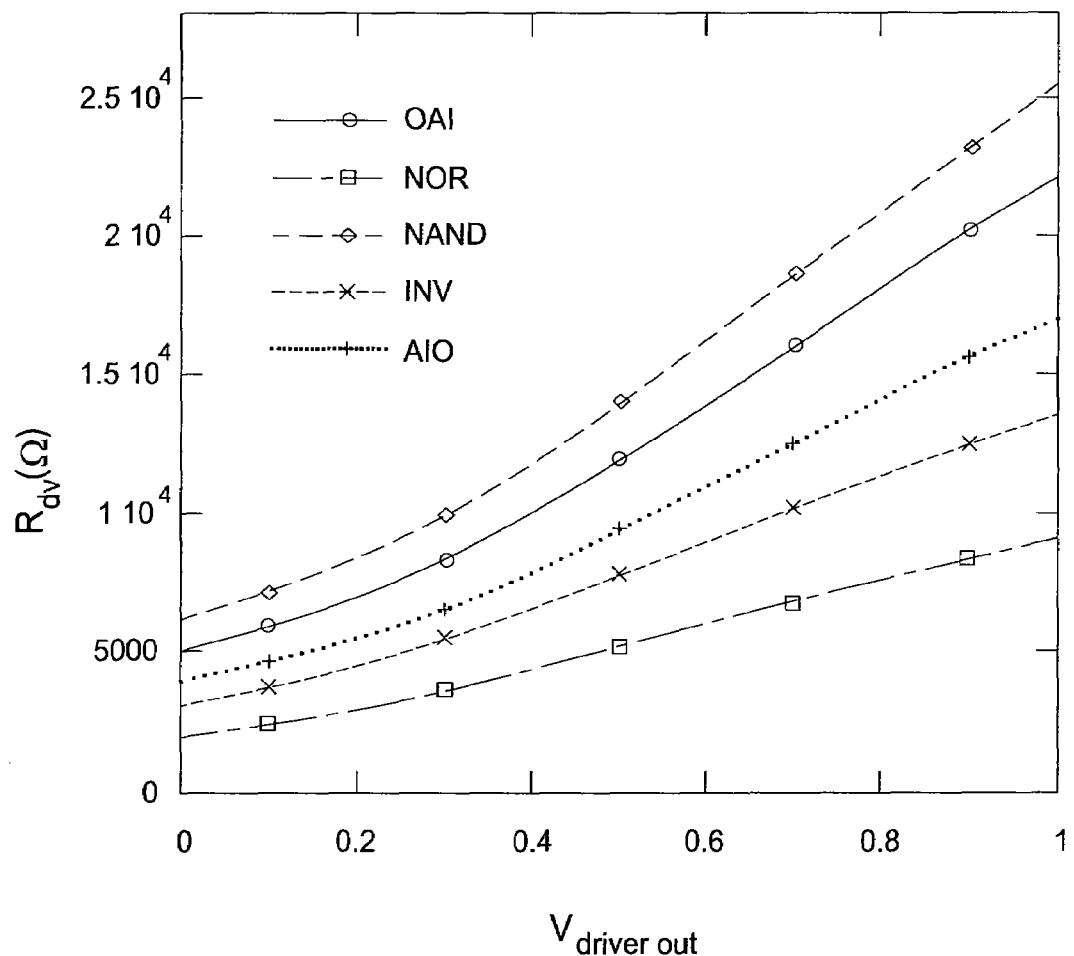
FIG. 4 is a graph illustrating the change in value of transistor resistance for an exemplary negative channel metal oxide semiconductor as a function of the output transition voltage.

FIG. 4 is a graph illustrating the change in value of transistor resistance, $R_{dv}$ for an exemplary negative channel metal oxide semiconductor (nMOS) as a function of the output transition voltage, $V_{driver\_out}$. As illustrated, the power dissipated by a transistor varies during switching. This is also true for the power dissipated in other semiconductor devices and in the interconnects coupled to the semiconductor devices on the chip.

Referring back to FIG. 3, in step 308, the method 300 calculates the power dissipated by the semiconductor devices and interconnects at a given temperature for the design under consideration. In one embodiment of step 308, e.g., where a steady-state analysis of the chip design is being performed, the interdependence of temperature and average power is captured through pre-characterized parameters of the semiconductor devices and interconnects. In one embodiment, the power dissipated by a semiconductor device (in this exemplary case, a transistor), $P_{transistor}$, is calculated as:

$$P_{transistor} = (V_d)^2 / R_{average} \quad \text{(EQN. 2)}$$

where $V_d$ is the power supply voltage supplied to the transistor. This voltage, $V_d$, is less than the actual power supply voltage, $V_{dd}$, as the current drawn by the transistors and flowing through the interconnects that connect the transistors to a power supply causes a voltage drop. In another embodiment, the power supply voltage to the transistor $V_d$ could be divided by the maximum or minimum resistance value, $R_{max}$ or $R_{min}$, in order to calculate the power dissipated in the transistor. In one embodiment, a decision as to whether to use an average, minimum or maximum resistance value to calculate $P_{transistor}$ is based at least in part on whether additional conditions, such as the operation of the circuit, are to be evaluated.

While equations for calculating the power dissipation of transistors have been provided herein by way of example, those skilled in the art will appreciate that various methods of calculating power dissipation for other semiconductor devices, such as resistors, capacitors and diodes, are known in the art. For example, equations for calculating the power dissipation of a resistor are discussed in the Proceedings of the Fourth International Symposium on Quality Electronic Design (ISQED 2003), 24-26 Mar. 2003, San Jose, Calif.

In one embodiment, the power dissipated by the interconnects (e.g., power and signal lines), $P_{interconnect}$ is calculated as:

$$P_{interconnect} = P - P_{transistor} \quad \text{(EQN. 3)}$$

where P is the average electrical power dissipated per clock cycle by a digital circuit (e.g., the chip design under consideration; for the full chip, the total P is the sum of the power dissipated by each circuit in the chip) and is available from the library data 202g. In the power lines, power is typically dissipated as Joule heating, where the dissipated power $P_{dissipated}$ may be calculated as:

$$P_{dissipated} = I_p^2 R_{power} \quad \text{(EQN. 4)}$$

where $I_p$ is the current through the power lines and $R_{power}$ is the resistance of the power bus. The value of Ip may be calculated by commercially available tools, such as Voltage Storm, available from Cadence Design Systems, Inc. of San Jose, Calif.

Typically, the power drawn by a switching transistor may be calculated as:

$$P = C_{load} V_{dd} E(\text{sw})(f\text{clk}) \quad \text{(EQN. 5)}$$

where $C_{load}$ is the output capacitance as seen by the circuit, E(sw) is the switching activity as defined by the average number of output transitions per clock period, and fclk is the clock frequency. The switching factor or acrivity, E(sw), is used for evaluating the power table for the initial state of the design. $C_{load}$ may be calculated by parasitic extraction tools, and values for fclk and $V_{dd}$ are typically specified for a given design. In general, half of the power, P, is stored in the capacitance and the other half is dissipated in the transistors and interconnects (e.g., the power and signal lines). Those skilled in the art will appreciate that since $R_{average}$ varies with the transition time of the circuits, and as the switching activity changes for different modes of operation, E(sw) will also change, thereby changing the value of P and the distribution of the amounts of power dissipated in the transistors (e.g., see Equation 2) and interconnects. This will, in turn, change the heat fields and corresponding temperatures within the chip.

In another embodiment of step 308, a transient analysis is performed, wherein the interdependence of temperature and average power in the semiconductor devices and interconnects is based on instantaneous values of power. In this case, power dissipated values are calculated by dynamically simulating the circuit embodied in the chip design under consideration. For example, the circuit may be simulated using any commercially available circuit simulator, such as HSPICE or HSIM, discussed above, or SPECTRE, commercially available from Cadence Design Systems. In one embodiment, the circuit is simulated by solving for values of electrical attributes (e.g., current and voltages) at various points in time. In the case of transient thermal analysis, the thermal analysis system (e.g., thermal analysis tool 200 of FIG. 2) drives the circuit simulator to calculate power at discrete points whenever there is a sufficient change in the temperature of the circuit. In one embodiment, the sufficiency of a temperature change for these purposes is determined by a predefined threshold.

In step 310, the method 300 distributes the power consumed in each of the interconnects. In one embodiment, power is distributed based on the resistance of the wires used in the interconnects, which is defined by the type, thickness and height of the wires used in the interconnects. In one embodiment, the resistance, $R_{interconnect}$, of an interconnect segment is calculated as:

$$R_{interconnect} = \frac{\rho L}{wt} \quad \text{(EQN. 6)}$$

where L is the length of the interconnect segment, w is the width of the segment, t is the thickness of the segment, and ρ is a resistivity constant dependent upon the type of wire used. The resistivity constant, ρ, may be found in tables included in any number of integrated circuits textbooks, including Rabaey et al., *Digital Integrated Circuits*, Second Edition, Prentice Hall Electronic and VLSI Series, 2002.

In step 312, the method 300 uses the power dissipation and distribution information calculated in steps 306-310 to model a full-chip (e.g., three-dimensional) temperature gradient over the chip design under consideration. In one embodiment, a full-chip temperature gradient is modeled by adaptively partitioning the volumes of steep temperature gradients over the chip design. In one embodiment, partitioning is done in three dimensions; however, in other embodiments, partitioning may be done in one or two dimensions as well (for example, vertical partitioning may be explicitly considered in how the temperature is modeled). In one embodiment, "steep" temperature gradients are those portions of the overall temperature gradient that are steep relative to other regions of the overall temperature gradient. In one embodiment, techfile data (e.g., pertaining to the dimensions and properties of the chip design layers) and power density data are used to partition the chip design. Power density data is typically contained within the power table provided for a particular state of operation of a chip design. The temperatures in each partition are then determined and annotated accordingly in the three-dimensional model.

In step 314, the method 300 determines whether the currently computed temperature for the chip design falls within a previously specified range. If the method 300 concludes that the currently computed temperature does not fall within this range, the method 300 proceeds to step 318 and modifies the chip design (e.g., by changing the resistances of the semiconductor devices and interconnects, resizing the semiconductor devices and interconnect wires, etc.). The method 300 then returns to step 308 and proceeds as discussed above.

Alternatively, if the method 300 determines that the currently computed temperature does fall within the specified range, the method 300 proceeds to step 316 and terminates. Thus, steps of the method 300 may be repeated in an iterative manner until a steady state value is reached, within a specified tolerance. In one embodiment, iteration of these steps may depend on the particular implementation of the method 300. In further embodiments, iteration could include convergence to an absolute value, convergence to a relative value, or the passing of a fixed number or iterations or a fixed amount of time.

Thus, the method 300 employs industry standard design, package and heat sink data in order to produce a more complete and more accurate profile of the temperature gradient created by a semiconductor chip design. By accounting for the distribution of power dissipated in the semiconductor devices and in the interconnects, rather than simply characterizing dissipated power as the power dissipated in the active semiconductor devices (which does not consider simultaneous changes in the electrothermal properties of the semiconductor devices and interconnects), more accurate, full-chip thermal profiling can be achieved.

Chip designers may use the full-chip data produced by the method 300 to design more robust semiconductor chips for particular applications. For example, if the full-chip temperature gradient produced by one iteration of the method 300 does not illustrate acceptable results for a semiconductor chip design, a chip designer may go back and modify the chip design (e.g., by changing the resistances of the semiconductor devices and interconnects, resizing the semiconductor devices and interconnect wires, etc.) in an attempt to achieve more desirable results. The method 300 may then be applied to the modified design to assess the resultant temperature gradient. Those skilled in the art will appreciate that while the method 300 illustrates a series of steps, the present invention is not limited to the particular sequence illustrated, and thus FIG. 3 should be considered only as one exemplary embodiment of the present invention.

Figure 5:
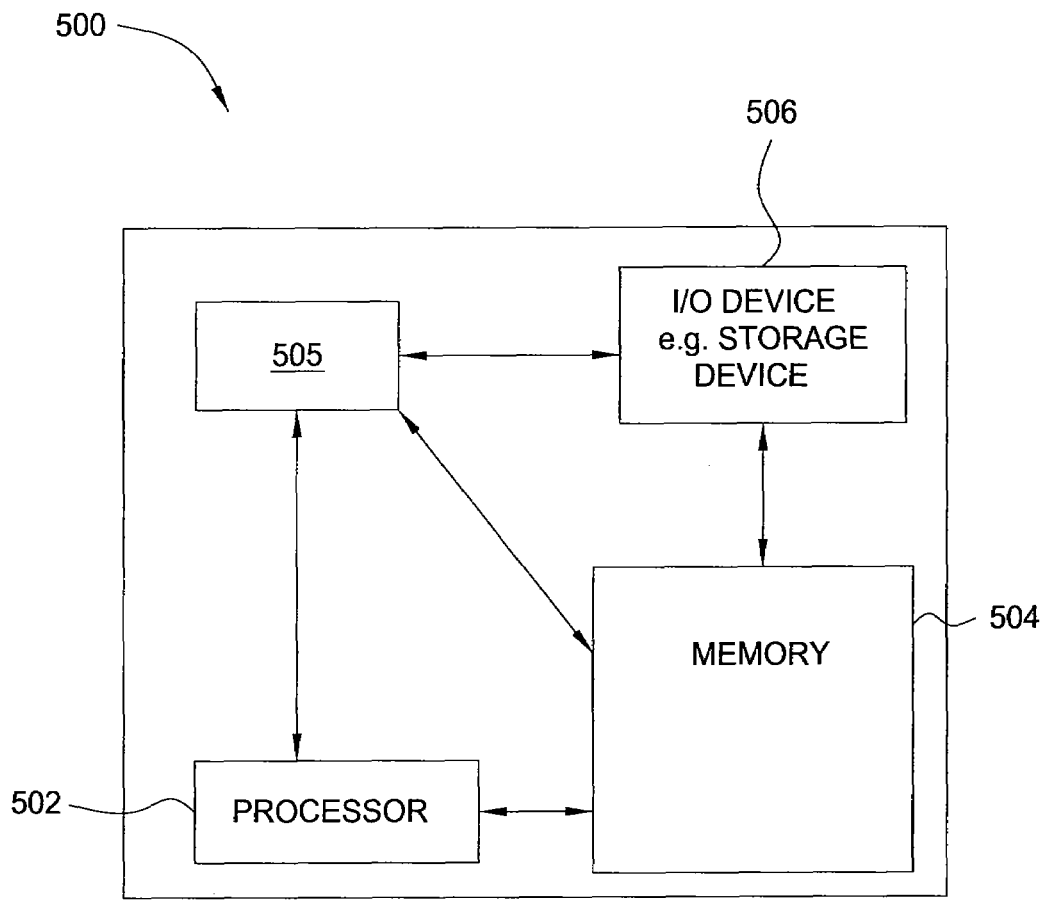
FIG. 5 is a high level block diagram of the present dynamic thermal analysis tool that is implemented using a general purpose computing device.

FIG. 5 is a high level block diagram of the present dynamic thermal analysis tool that is implemented using a general purpose computing device 500. In one embodiment, a general purpose computing device 500 comprises a processor 502, a memory 504, a thermal analysis module 505 and various input/output (I/O) devices 506 such as a display, a keyboard, a mouse, a modem, a network connection and the like. In one embodiment, at least one I/O device is a storage device (e.g., a disk drive, an optical disk drive, a floppy disk drive). It should be understood that the thermal analysis module 505 can be implemented as a physical device or subsystem that is coupled to a processor through a communication channel.

Alternatively, the thermal analysis module 505 can be represented by one or more software applications (or even a combination of software and hardware, e.g., using Application Specific Integrated Circuits (ASIC)), where the software is loaded from a storage medium (e.g., I/O devices 506) and operated by the processor 502 in the memory 504 of the general purpose computing device 500. Additionally, the software may run in a distributed or partitioned fashion on two or more computing devices similar to the general purpose computing device 500. Thus, in one embodiment, the thermal analysis module 505 for three-dimensional thermal analysis of semiconductor chip designs described herein with reference to the preceding figures can be stored on a computer readable medium or carrier (e.g., RAM, magnetic or optical drive or diskette, and the like).

Thus, the present invention represents a significant advancement in the field of semiconductor chip design. One embodiment of the invention provides an inventive method for concurrently assessing the distribution of power dissipated in both the transistors and wire interconnects in a semiconductor chip design, thereby accounting for the interdependent effects of the heat fields within the different layers of the chip at the same time. The distributed power dissipation information can then be used to create a full-chip (e.g., three-dimensional) model of the thermal gradient over the chip, providing more accurate and more complete information upon which chip designers can assess expected performance of their designs.

While the foregoing is directed to embodiments of the invention, other and further embodiments of the invention may be devised without departing from the basic scope thereof, and the scope thereof is determined by the claims that follow.

What is claimed is:

1. A method for performing thermal analysis of a semiconductor chip design, the semiconductor chip design comprising a plurality of elements, the elements including one or more embedded semiconductor devices and one or more embedded interconnects, the method comprising:

receiving, for each of at least some of the plurality of elements, a respective at least one semiconductor chip design parameter; and calculating, using a processor, the power dissipated by the at least some of the plurality of elements, in accordance with the respective at least one semiconductor chip design parameter;

distributing power dissipated by the at least some of the plurality of elements among the plurality of elements; and constructing using a processor a three-dimensional full-chip thermal model of the semiconductor chip design in accordance with the distributed power, the thermal model depicting computed temperatures for the at least some of the plurality of elements, wherein the constructing comprises:

adaptively partitioning the thermal model in response to volumes of steep thermal gradients over the semiconductor chip design, wherein the volumes of steep thermal gradients are determined to be steep relative to other regions of an overall temperature gradient for the semiconductor chip design;

wherein the at least some of the plurality of elements includes at least one of the one or more embedded interconnects, and wherein the one or more embedded interconnects are deployed, at least in part, to connect the one or more embedded semiconductor devices.

2. The method of claim 1, wherein the semiconductor chip design represents a semiconductor chip to be fabricated in accordance with at least one of: a complementary metal-oxide semiconductor methodology or a gallium arsenide methodology.

3. The method of claim 1, wherein the partitioning is performed in one of: one dimension, two dimensions or three dimensions.

4. The method of claim 1, wherein the at least one semiconductor chip design parameter comprises at least one of: design data or library data.

5. The method of claim 4, wherein the design data comprises industry standard design data.

6. The method of claim 4, wherein the design data comprises at least one of electrical component extraction data, extracted parasitic data, design representations, layout data, techfiles describing layer information or package models, power tables and associated switching data.

7. The method of claim 4, wherein the library data comprises data relating to at least one of the plurality of elements.

8. The method of claim 1, wherein the method is implemented to account for interdependent heat fields among the plurality of elements.

9. The method of claim 1, wherein the method is implemented for a steady state thermal analysis.

10. The method of claim 1, wherein the method is implemented for a transient thermal analysis.

11. The method of claim 1, further comprising:
dynamically simulating a circuit embodied in the semiconductor chip design.

12. The method of claim 11, wherein the power dissipated by the at least some of the plurality of elements is calculated based on the simulated circuit.

13. The method of claim 1, wherein the dissipated power is distributed in at least one of the one or more embedded interconnects based on one or more electrical properties of the least one of the one or more embedded interconnects.

14. The method of claim 13, wherein the one or more electrical properties includes resistances.

15. A computer readable storage medium containing an executable program for performing thermal analysis of a semiconductor chip design, the semiconductor chip design comprising a plurality of elements, the elements including one or more embedded semiconductor devices and one or more embedded interconnects, where the program performs the steps of:
receiving, for each of at least some of the plurality of elements, a respective at least one semiconductor chip design parameter; and
calculating the power dissipated by the at least some of the plurality of elements, in accordance with the respective at least one semiconductor chip design parameter;
distributing power dissipated by the at least some of the plurality of elements among the plurality of elements; and
constructing a three-dimensional full-chip thermal model of the semiconductor chip design in accordance with the distributed power, the thermal model depicting computed temperatures for the at least some of the plurality of elements, wherein the constructing comprises:
adaptively partitioning the thermal model in response to volumes of steep thermal gradients over the semiconductor chip design, wherein the volumes of steep thermal gradients are determined to be steep relative to other regions of an overall temperature gradient for the semiconductor chip design;
wherein the at least some of the plurality of elements includes at least one of the one or more embedded interconnects and wherein the one or more embedded interconnects are deployed, at least in part, to connect the one or more embedded semiconductor devices.

16. The computer readable medium of claim 15, wherein the semiconductor chip design represents a semiconductor chip to be fabricated in accordance with at least one of: a complementary metal-oxide semiconductor methodology or a gallium arsenide methodology.

17. The computer readable medium of claim 15, wherein the partitioning is performed in one of: one dimension, two dimensions or three dimensions.

18. The computer readable medium of claim 15, wherein the at least one semiconductor chip design parameter comprises at least one of: design data or library data.

19. The computer readable medium of claim 18, wherein the design data comprises industry standard design data.

20. The computer readable program of claim 15, wherein the method is implemented to account for interdependent heat fields among the plurality of elements.

21. Apparatus for performing thermal analysis of a semiconductor chip design, the semiconductor chip design comprising a plurality of elements, the elements including one or more embedded semiconductor devices and one or more embedded interconnects, the apparatus comprising:
means for receiving, for each of at least some of the plurality of elements, a respective at least one semiconductor chip design parameter; and
means for calculating the power dissipated by the at least some of the plurality of elements, in accordance with the respective at least one semiconductor chip design parameter;
means for distributing power dissipated by the at least some of the plurality of elements among the plurality of elements; and
means for constructing a three-dimensional full-chip thermal model of the semiconductor chip design in accordance with the distributed power, the thermal model depicting computed temperatures for the at least some of the plurality of elements, wherein the means for constructing comprises:
means for adaptively partitioning the thermal model in response to volumes of steep thermal gradients over the semiconductor chip design, wherein the volumes of steep thermal gradients are determined to be steep relative to other regions of an overall temperature gradient for the semiconductor chip design;
wherein the at least some of the plurality of elements includes at least one of the one or more embedded interconnects and wherein the one or more embedded interconnects are deployed, at least in part, to connect the one or more embedded semiconductor devices.

* * * * *